United States Patent
Jiang (10) Patent No.: US 7,348,820 B2
(45) Date of Patent: *Mar. 25, 2008

(54) METHOD AND APPARATUS FOR GLITCH-FREE CONTROL OF A DELAY-LOCKED LOOP IN A NETWORK DEVICE

(75) Inventor: Yong H. Jiang, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/511,309

(22) Filed: Aug. 29, 2006

(65) Prior Publication Data

US 2006/0290396 A1 Dec. 28, 2006

Related U.S. Application Data

(63) Continuation of application No. 10/845,360, filed on May 14, 2004, now Pat. No. 7,132,866.

(51) Int. Cl.
*H03L 7/06* (2006.01)

(52) U.S. Cl. ........................... 327/158; 327/149
(58) Field of Classification Search ............... None
See application file for complete search history.

(56) References Cited

U.S. PATENT DOCUMENTS

| | | | | |
|---|---|---|---|---|
| 5,278,789 | A | 1/1994 | Inoue et al. | 365/189.01 |
| 5,742,613 | A | 4/1998 | MacDonald | 714/711 |
| 5,831,980 | A | 11/1998 | Varma et al. | 370/395.72 |
| 5,892,922 | A | 4/1999 | Lorenz | 709/238 |
| 6,064,869 | A * | 5/2000 | Davis et al. | 455/260 |
| 6,125,157 | A | 9/2000 | Donnelly et al. | 375/371 |
| 6,175,902 | B1 | 1/2001 | Runaldue et al. | 711/159 |
| 6,262,608 | B1 * | 7/2001 | O'Hearcain et al. | 327/142 |
| 6,456,130 | B1 | 9/2002 | Schnell | 327/156 |
| 6,539,072 | B1 | 3/2003 | Donnelly et al. | 375/371 |
| 6,570,944 | B2 | 5/2003 | Best et al. | 375/355 |
| 6,642,762 | B2 | 11/2003 | Von Kaenel | 327/158 |
| 6,710,636 | B1 | 3/2004 | Gibbs et al. | 327/158 |
| 6,735,669 | B2 | 5/2004 | Shin | 711/106 |
| 6,791,360 | B2 * | 9/2004 | Gauthier et al. | 326/93 |
| 2002/0125926 | A1 * | 9/2002 | Schnell | 327/156 |
| 2002/0136082 | A1 * | 9/2002 | Chu et al. | 365/233 |

FOREIGN PATENT DOCUMENTS

| | | |
|---|---|---|
| EP | 0752796 A2 | 1/1997 |
| JP | 04-189023 | 7/1992 |

\* cited by examiner

*Primary Examiner*—Cassandra Cox
(74) *Attorney, Agent, or Firm*—Squire Sanders & Dempsey L.L.P.

(57) ABSTRACT

A method of controlling a delay-locked loop (DLL) module is disclosed. The method includes the steps of receiving a clock signal, comparing the received clock signal with a reference clock signal to determine whether a required phase difference between the signals is within specified tolerances, producing a correction signal when the required phase difference between the received clock and reference clock signals is not within the specified tolerances, utilizing the correction signal to change a delay setting and forwarding the correction signal to slave DLL modules in communication with the DLL module. The comparing, producing, utilizing and forwarding steps are performed only after a period of time has elapsed from a prior incidence of the comparing, producing, utilizing and forwarding steps, where the period of time is sufficient to allow the DLL to settle and no extraneous results are produced.

21 Claims, 6 Drawing Sheets

METHOD AND APPARATUS FOR GLITCH-FREE CONTROL OF A DELAY-LOCKED LOOP IN A NETWORK DEVICE

REFERENCE TO RELATED APPLICATIONS

This application claims priority of U.S. patent application Ser. No. 10/845,360, filed on May 14, 2004, which claims priority of U.S. Provisional Patent Application Ser. No. 60/499,616, filed on Sep. 3, 2003, and U.S. Provisional Patent Application Ser. No. 60/553,122, filed on Mar. 16, 2004. The subject matter of these earlier filed applications is hereby incorporated by reference.

BACKGROUND OF THE INVENTION

1. Field of the Invention

The present invention relates to devices, software applications and networks that utilize data that is sent or received over data communication or computer networks. In particular, the present invention is directed to management and use of memory in a network device to implement certain policies. The processor and methods described provide greater reliability in the use of external memory to process the data sent and received by the network device.

2. Description of Related Art

As computer performance has increased in recent years, the demands on computer networks has significantly increased; faster computer processors and higher memory capabilities need networks with high bandwidth capabilities to enable high speed transfer of significant amounts of data. The well-known Ethernet technology, which is based upon numerous IEEE Ethernet standards, is one example of computer networking technology which has been able to be modified and improved to remain a viable computing technology.

Based upon the Open Systems Interconnect (OSI) 7-layer reference model, network capabilities have grown through the development of repeaters, bridges, routers, and, switches, which operate with various types of communication media. Collectively, with respect to the present invention, all of these may be referred to as network devices. Switches, as they relate to computer networking and to Ethernet, are hardware-based devices which control the flow of datagrams, data packets or cells based upon destination address information which is available in each packet. A properly designed and implemented switch should be capable of receiving a packet and switching the packet to an appropriate output port at the maximum speed capability of the particular network.

Referring to the OSI 7-layer reference model discussed previously, the higher layers typically have more information. Various types of products are available for performing switching-related functions at various levels of the OSI model. Hubs or repeaters operate at layer 1, and essentially copy and "broadcast" incoming data to a plurality of spokes of the hub. Layer 2 switching-related devices are typically referred to as multiport bridges, and are capable of bridging two separate networks. Bridges can create a table of forwarding rules based upon which MAC (media access controller) addresses exist on which ports of the bridge, and pass packets that are destined for an address which is located on an opposite side of the bridge. Bridges typically utilize what is known as the "spanning tree" algorithm to eliminate potential data loops; a data loop is a situation wherein a packet endlessly loops in a network looking for a particular address. The spanning tree algorithm defines a protocol for preventing data loops. Layer 3 switches, sometimes referred to as routers, can forward packets based upon the destination network address. Layer 3 switches are capable of learning addresses and maintaining tables thereof which correspond to port mappings. Processing speed for layer 3 switches can be improved by utilizing specialized high performance hardware, and off loading the host CPU so that instruction decisions do not delay packet forwarding.

In addition, there has also been pressure from the implementers of the computer networks to have network devices to mediate traffic on the computer networks that are extremely flexible and low cost. One aspect of this lower cost can be the use of external memory, i.e. memory that does not natively reside within the network device. A network device may use external memory, at least in part, to temporarily store data that is received by the network device. This allows for the external memory to be switched out, if needed, without requiring revamping of the chip that makes up the network device.

The interface between the network switch and the external memory becomes more important as the throughput for the external memory increases. For example, for external memory such as 200 Mhz Double Data Rate Synchronous Dynamic Random Access Memory (DDR SDRAM), the interface and the memory controller must be able to read and write data at that frequency. In the past, the level of precision with respect to the timing control elements did not have to be as greater to accommodate slower memory.

To accomplish this, a master Delay-Locked Loop (DLL) is used to set the number of delay taps and used to set a 90 degree phase difference that is required by the memory. This is desirable because the clock edge should be centered right in the middle of the window for the memory because that is preferred. The signal from the master DLL is sent to slave DLLs that are populated in the memory channels of the network device. Thus, one command center receives the clock signal, the same clock signal used by the memory, and the proper signals are then used for all of the memory channels. The signal the master DLL sends out, after performing the proper locking, controls up to a 32-bit delay tap in the delay line.

However, as discussed above, problems can occur with the DLL functioning when the memory has a higher throughput and detection and correction must occur at higher speeds. One such problem can occur in that the phase shift must be detected to determine if it is still 90 degrees. As time goes by, the voltages and settings in the network device may shift and other changes may occur. The DLL needs to react to its working environment and automatically change its settings accordingly. One issue is how often to compare clock edges. If they are compared on every rising edge and adjustments are made in every cycle, then certain design issues must be addressed. If the DLL must lookup, update and reset for the next cycle, certain glitches may be introduced. In other words, things may not momentarily be set correctly. At low frequency, the glitches settle out long before the affect performance. However, at higher frequencies, the glitches cause many problems.

SUMMARY OF THE INVENTION

According to one embodiment of the invention, a method of controlling a delay-locked loop (DLL) module is disclosed. The method includes the steps of receiving a clock signal, comparing the received clock signal with a reference clock signal to determine whether a required phase difference between the signals is within specified tolerances, producing a correction signal when the required phase difference between the received clock and reference clock signals is not within the specified tolerances, utilizing the correction signal to change a delay setting and forwarding the correction signal to slave DLL modules in communication with the DLL module. The comparing, producing, utilizing and forwarding steps are performed only after a period of time has elapsed from a prior incidence of the comparing, producing, utilizing and forwarding steps, where the period of time is sufficient to allow the DLL to settle and no extraneous results are produced.

Additionally, the period of time may be a predetermined number of clock cycles, where the number of clock cycles may be four. The method may also include updating a state register for the DLL based on whether the DLL is in a locked state. Also, the step of producing a correction signal may include generating a lead signal and a lag signal when the required phase difference between the received clock and reference clock signals is not within the specified tolerances.

In addition, the step of receiving a clock signal may include receiving a clock signal used to control an external memory, where the DLL performs its function as a timing control module for a memory interface. Additionally, the external memory may be a 200 Mhz Double Data Rate Synchronous Dynamic Random Access Memory.

According to another embodiment, a delay-locked loop (DLL) module is disclosed. The module includes receiving means for receiving a clock signal, comparing means for comparing the clock signal, received by the receiving means, with a reference clock signal to determine whether a required phase difference between the signals is within specified tolerances, correction means for producing a correction signal when the required phase difference between the received clock and reference clock signals is not within the specified tolerances, delay setting means for utilizing the correction signal to change a delay setting and forwarding means for forwarding the correction signal to slave DLL modules in communication with the DLL module. The comparing, correction, delay setting and forwarding means are configured to perform only after a period of time has elapsed from a prior use of the comparing, correction, delay setting and forwarding means, where the period of time is sufficient to allow the DLL to settle and no extraneous results are produced.

According to another embodiment, a delay-locked loop (DLL) module is disclosed. The module includes a receiver for receiving a clock signal, a phase detector for comparing the clock signal, received by the receiving means, with a reference clock signal to determine whether a required phase difference between the signals is within specified tolerances, a correction circuit for producing a correction signal when the required phase difference between the received clock and reference clock signals is not within the specified tolerances, a delay setter for utilizing the correction signal to change a delay setting, a forwarder for forwarding the correction signal to slave DLL modules in communication with the DLL module and a counter, in communication with the phase detector, the correction circuit, the delay setter and the forwarder. The phase detector, the correction circuit, the delay setter and the forwarder are configured to perform only after the counter has counted for a period of time from a prior use of the phase detector, the correction circuit, the delay setter and the forwarder, where the period of time is sufficient to allow the DLL to settle and no extraneous results are produced.

These and other variations of the present invention will be described in or be apparent from the following description of the preferred embodiments.

BRIEF DESCRIPTION OF THE DRAWINGS

For the present invention to be easily understood and readily practiced, the present invention will now be described, for purposes of illustration and not limitation, in conjunction with the following figures.

DETAILED DESCRIPTION OF PREFERRED EMBODIMENTS

Figure 1:
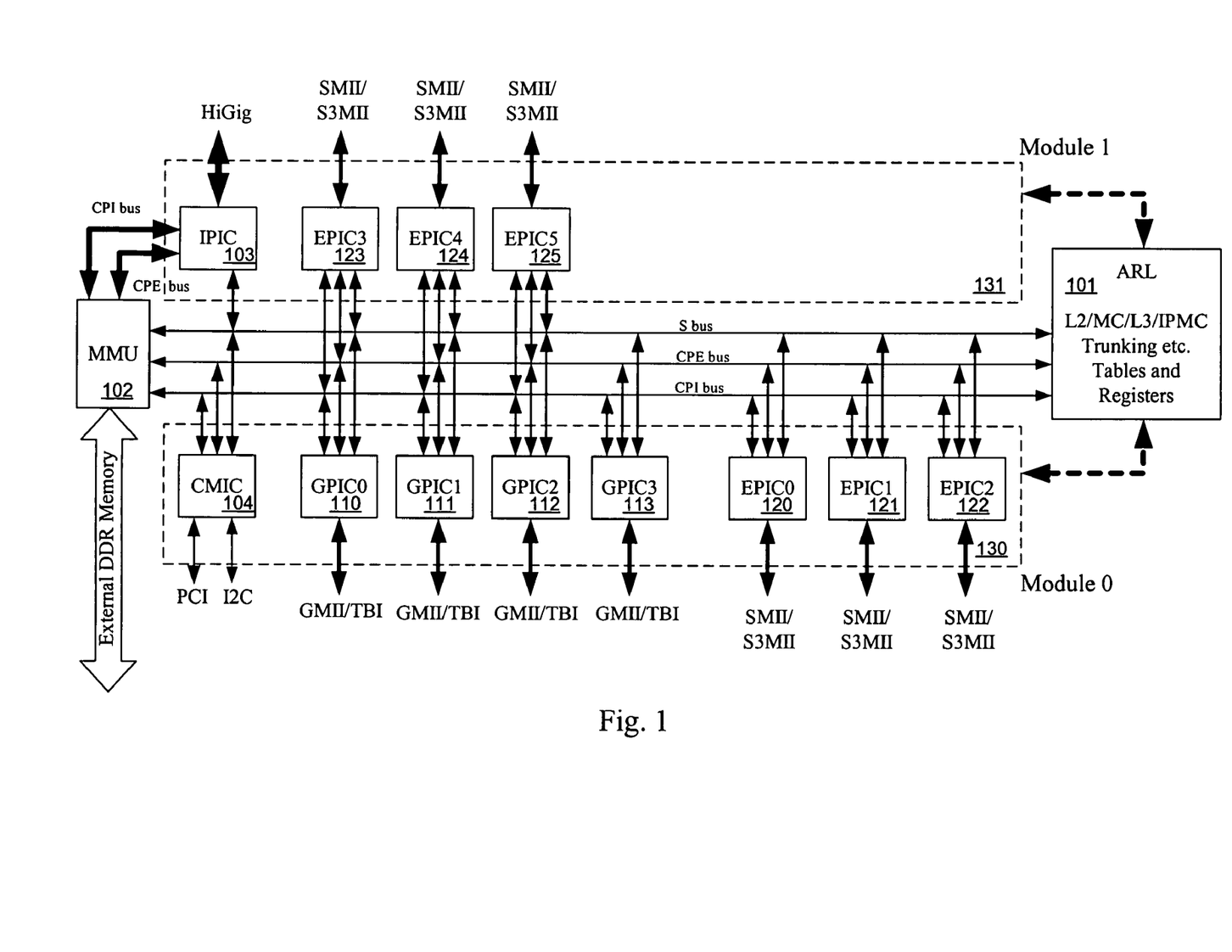
FIG. 1 illustrates a block diagram providing the basic elements of a network device, according to one embodiment of the present invention.

The present invention is directed, in one embodiment, to a network device that receives data and process that data and may forward that data onto a destination based on attributes of that data. A general schematic of the network device is illustrated in FIG. 1. The device has an address resolution module (ARL) 101 that provides support for Layer 2 (L2), Multicast (MC), Layer 3 (L3), Internet Protocol Multicast (IPMC) switching, as well as Trunking, through various tables and registers. The ARL is connected to elements of the network switch divided into different modules. The ARL is also connected through a bus made up of channels, with data transferred on the CPI bus, protocols transferred therewith on the CPE bus and the S bus which is a sideband bus and is used to transfer signals between portions of the network device.

The bus can provide connections between the Memory Management Unit (MMU) and other interface modules. The interface modules include Ethernet Port Interface Controllers (EPICs) 120-125, Gigabit Port Interface Controllers (GPICs) 110-113, Interconnect Port Interface Controller (IPIC) 103, and CPU Management Interface Controller (CMIC) 104. The above components are discussed below. In addition, a Central Processing Unit (CPU) can be used as necessary to program the network device with rules which are appropriate to control packet processing. However, once network device is appropriately programmed or configured, it operates, as much as possible, in a free running manner without communicating with CPU.

As discussed above, the network device can have two module IDs, with module id 0 covering the Gigabit Ethernet ports, the CMIC and EPICs 0 through 2 and with module id 1 covering the IPIC and EPICs 3 through 5. The device may support 16K MAC address with 256 Layer 2 multicast addresses and 4K VLANs. The device also may support 256 multiple spanning trees and 8 levels of Class of Service. The device also supports protocol based VLANs with priority fields and supports jumbo frames. It also supports Layer 2 Multiprotocol Label Switching (MPLS) and supports classification for multiple packet formats, including Ipv6, Ipv4, double tagged, HTLS, 802.1Q tagged, Ether II and 802.3.

The GPIC modules (110-113) can interface to the Gigabit ports and on the medium side it interfaces to the TBI/GMII or MII from 10/100 and on the chip fabric side it interfaces to the bus. Each GPIC supports 1 Gigabit port or a 10/100 Mbps port. Each GPIC performs both the ingress and egress functions. The EPIC modules (120-125) interface to the 10/100-Mbit Ethernet ports and on the medium side it interfaces to the SMII/S3II and on the chip fabric side it interfaces to the bus. Each GPIC supports an Ethernet port. A standard 802.3u MIIM interface is supported to interface with PHY devices, a standard JTAG interface for boundary scan and an LED interface to control system LEDs.

The IPIC 103 module can interface to the bus on one side and a high speed interface, such as a HIGIG interface, on the other side. The high speed bus can be, for example, is a XAUI interface, providing a total bandwidth of 10 Gbps. The CMIC 104 block is the gateway to the host CPU. In it's simplest form it provides sequential direct mapped accesses between the CPU and the network device. The bus interface may be a 66 MHz PCI. In addition, an I2C (2-wire serial) bus interface may supported by the CMIC, to accommodate low-cost embedded designs where space and cost are a premium.

The device can also support metering, with a granularity of, for example, 64 kb/s, having bucket sizes between 4 k and 512 k. The device may also include counters based on packet number or bytes, with those counters being in-profile, out-profile or general purpose. The device also allows for rate limiting or shaping. The device includes Ingress per port rate limiting, where when the incoming bandwidth exceed a programmed threshold, the port can either send a pause frame or drop packets. The rate control is on a per port basis and support for Egress per port rate limiting.

Support may also be provided for rapid spanning tree protocol that may be deleted by the port and storm control on a per port basis. The network device may also support link aggregation, with, for example, 32 trunk groups, with up to 8 ports in a trunk group. Trunking is also supported across modules and the load may be distributed based on source MAC or IP address and/or destination MAC or IP address.

The packet buffer memory of the device may include external DDR SDRAM memory with a 128 data bit DDR SDRAM interface, configured as 4 independent channels according to several embodiments. Each channel consists of 32 data bits and it own address and control signals. The network device supports 32 MB or 64 MB packet buffer memory size, X16 and X32 DDR SDRAM memory and 166 MHz to 200 MHz clock DDR SDRAM memory. For reliability and signal integrity, there is support for CRC16 on every pointer, CRC5 on every cell and CRC32 on every frame. There is also support for a packet aging mechanism based on packet time stamp.

A fast filtering processor (FFP) can be incorporated into the EPICs and GPICs, in order to accelerate packet forwarding and enhance packet flow. The FFP is essentially a state machine driven programmable rules engine. Filters are applied to packets received by the FFP, through the use of masks so that certain fields of a packet may be evaluated. The filters utilized by FFP are defined by a rules table, where that table is completely programmable by the CPU, through the CMIC. The actions taken based on the filtering of the FFP include 802.1p tag insertion, 802.1p priority mapping, IP TOS (type-of-service) tag insertion, sending of the packet to the CPU, discarding or dropping of the packet and forwarding the packet to an egress port.

The network device may also provide supports for differentiated services. The differentiated services may include metering, per ingress port and per flow, policing, per egress port, re-marking, including DSCP (IPv4 and IPv6) re-marking, re-marking based on inclusive or exclusive matches in the FFP, and classification based on incoming DSCP, and dropping, as a result of metering or filtering. A pulse may be used to refresh all meters across the network device, including ingress metering, FFP metering, egress metering and WFQ MMU meters.

There are several mechanisms for buffering of packets and advanced methods for controlling the flow of packets. These include cell-based Head Of Line (HOL) blocking prevention that is programmable and is based on the total packet memory used by each Class of Service (CoS) per port. Packet-based HOL blocking prevention is also programmable and is based on the number of packets per CoS queue for each port. These mechanisms also support tail drop for CNG for HOL of 25%, 50%, 75% and 100% and supports centralized per port HOL counter. The mechanisms may also address back pressure, per ingress port and per flow through the FFP. The latter includes pause frame support (symmetric and asymmetric IEEE 802.3x) and a jamming mechanism for half-duplex ports. A Weighted Random Early Detection (WRED) congestion control per CoS queue per port is also available. Random Early Detection is a congestion avoidance mechanism that takes advantage of TCP's congestion control mechanism. By randomly dropping packets prior to periods of high congestion, RED tells the packet source to decrease its transmission rate. Assuming the packet source is using TCP, it will decrease its transmission rate until all the packets reach their destination, indicating that the congestion is cleared.

Figure 2:
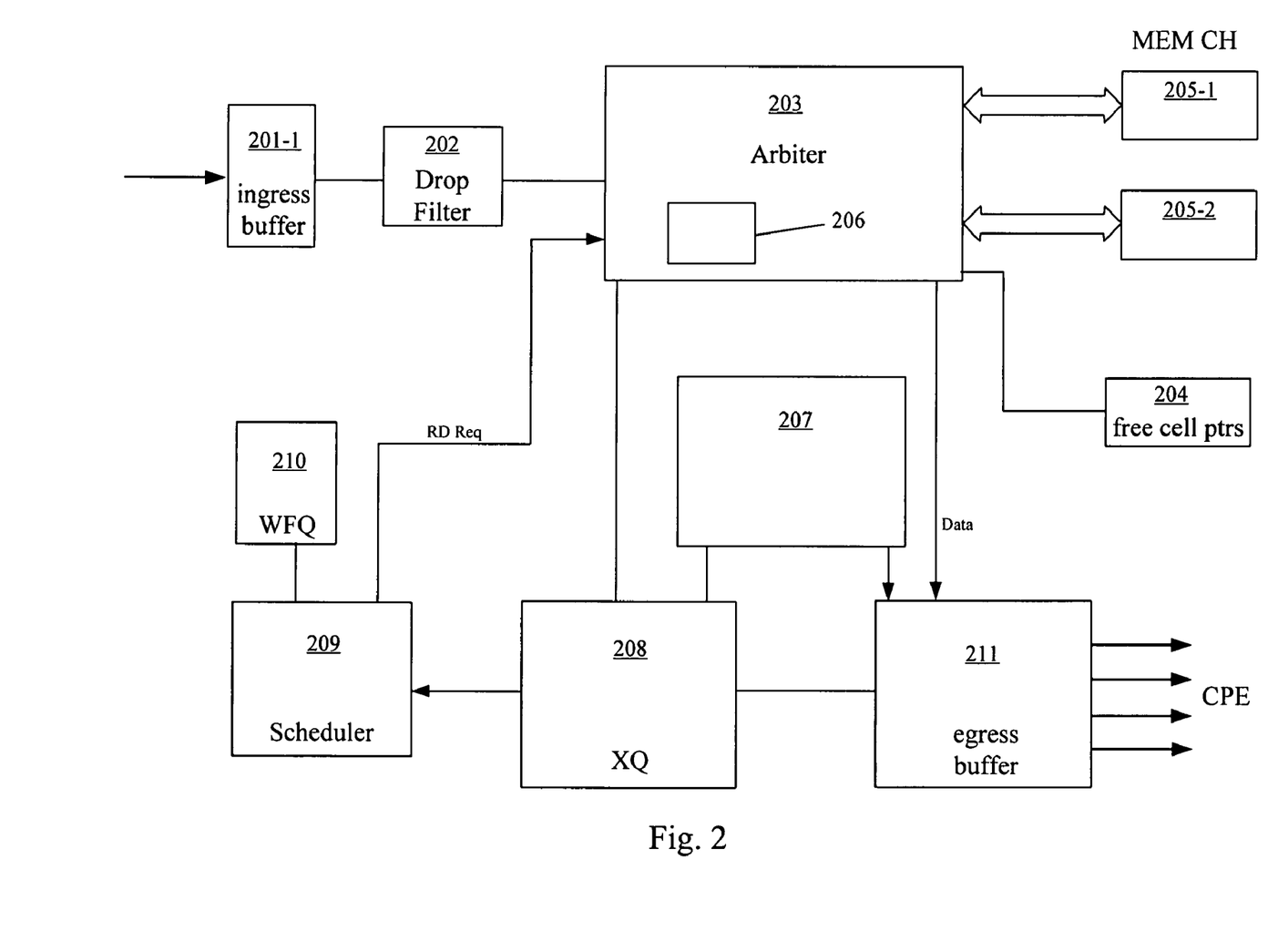
FIG. 2 provides a block diagram illustrating elements used to process packets by the network switch, according to one embodiment of the present invention.

Data passes from the ingress buffer 201-1, in FIG. 2, to a drop filter 202 that may drop the packet based on programmed criteria. The packet data then passes to an arbiter 203, that has its own random access memory 206. The arbiter controls access to the memory channels 205-1 and 205-2 where packet data is stored. The arbiter communicates with a free cell pointer module 204 that provides a pointer to the next available free cells in the memory. The arbiter also is in communication with the egress queue 208 and egress buffer 211 modules. The egress buffer receives the packet data when it is ready to be sent out on the CPE interface. The egress queue module is also in communication with a scheduler 209 that schedules which packets and in what order they are sent out. The scheduler also communicates with a weighted fair queue 210 module to assist in making scheduling decisions, where those decisions result in specific read requests being sent to the arbiter.

As discussed above, problems occur with the DLL functioning when the memory has a higher throughput and detection and correction must occur at higher speeds. One such problem occurs in that the phase shift must be detected to determine if it is still 90 degrees. As time goes by, the voltages and settings in the network device may shift and other changes may occur. The DLL needs to react to its working environment and automatically change its settings accordingly.

One issue is how often to compare clock edges. If they are compared on every rising edge and adjustments are made in every cycle, then certain design issues must be addressed. If the DLL must lookup, update and reset for the next cycle, certain glitches may be introduced. In other words, things may not momentarily be set correctly. At low frequency, the glitches settle out long before the affect performance. However, at higher frequencies, the glitches cause many problems.

In the present invention, instead of comparing every rising edge, and updating the counters and delay settings on every cycle, a lower frequency of examination is adopted. In one embodiment of the present invention, the comparison is made every fourth cycle. This removes the problem that can occur if the prior update is not completely finished by the time the next cycle occurs. If the update is not completed, the DLL could be locked at the wrong frequency or may simply malfunction. The present invention avoids the need to include circuitry to detect the glitches or some other mechanism to compensate. Since every fourth cycle, for example, is examined, even if glitches are generated, they are ignored. In other words, the present invention reduces the possibility of DLL errors by not looking at every clock cycle.

In addition, the present invention also has the benefit that a very accurate lock or out of lock status for the DLL can be detected. The accuracy is to within 0.2% and provides a very accurate indication of whether the DLL is locked or not. In certain embodiments of the present invention, the lock or out of lock status is saved in a register so that it may be accessed by other components of the network device or external components with access to the network device's internal bus. The register may be instrumental in trouble shooting the operation of the network device or providing some higher level indication of the DLL's operation.

In certain embodiments, the present invention removes a pitfall in the high speed DLL design. When the phase detector detects the feed-clock is off align with the reference clock, a "lead" or "lag" signal is issued. The control circuit uses this signal to change the setting in the DLL's delay chain. In the high frequency design, the loop delay from the "lead"/"lag" signal activates to the delay line settles after the control circuit update can often be long enough to cause the subsequent feed-clock edge to be misplaced. Thus, it could cause the phase detector to issue wrong "lead"/"lag" signals. The design and method of the present invention, instead, allows a particular number of cycles to update and ignore the immediate edge and remove the potential "glitch" in the control circuit.

Figure 3:
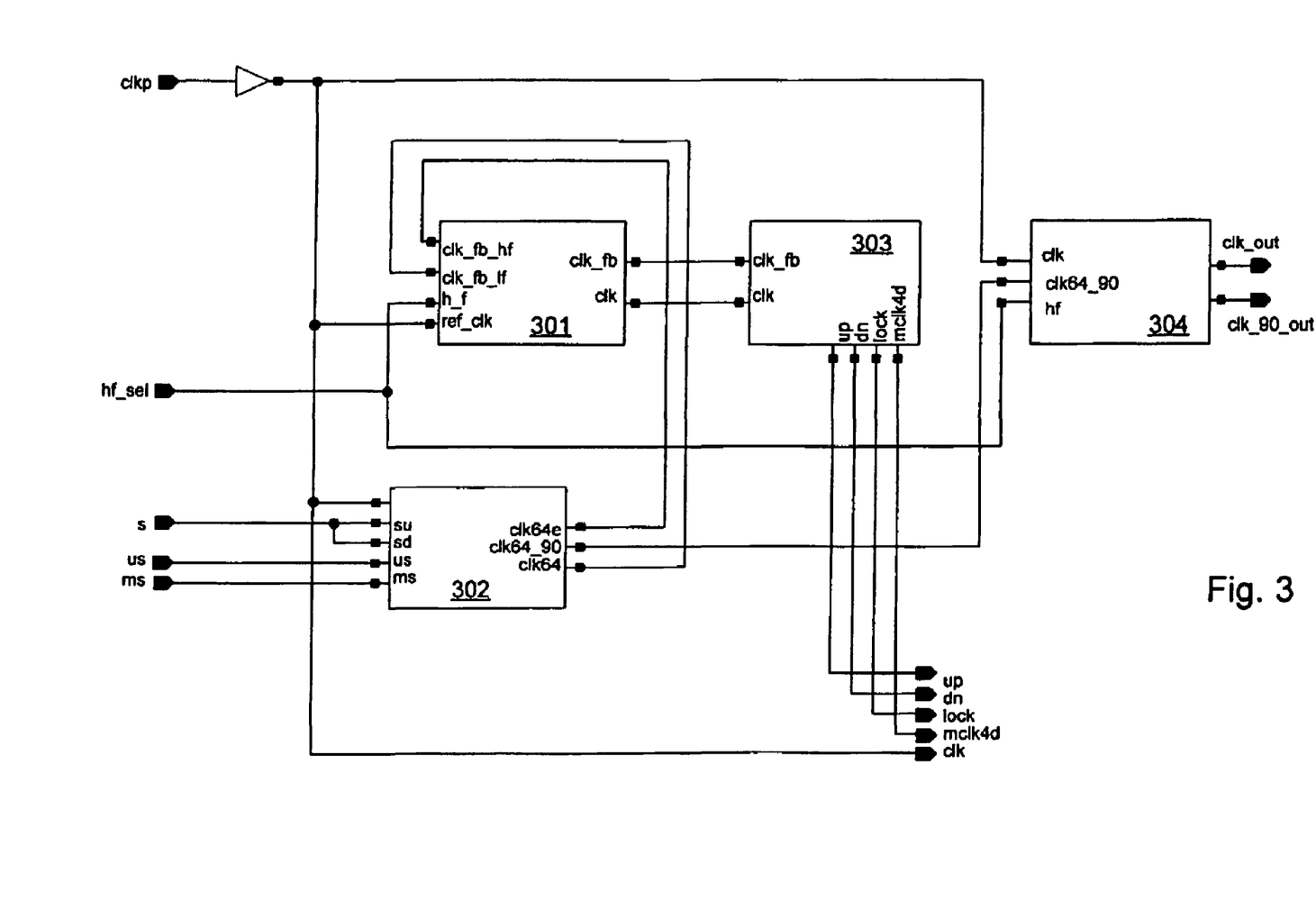
FIG. 3 provides a block diagram illustrating the structure of DLL, according to one embodiment of the present invention.

FIG. 3 illustrates schematically a DLL circuit according to one embodiment of the present invention. The clock is introduced at clkp and clkn and is included as inputs to the DLL adjustment module 301, the delay module 302 and the output module 304. The resulting outputs of clk_out and clk_90_out are a clock signal and the 90 degree phase shifted clock signal. The up, dn, lock, clk and mclk4$d$ go to a counter block, where the mclk4$d$ also goes out to the slave DLs to provide their proper function.

Figure 4:
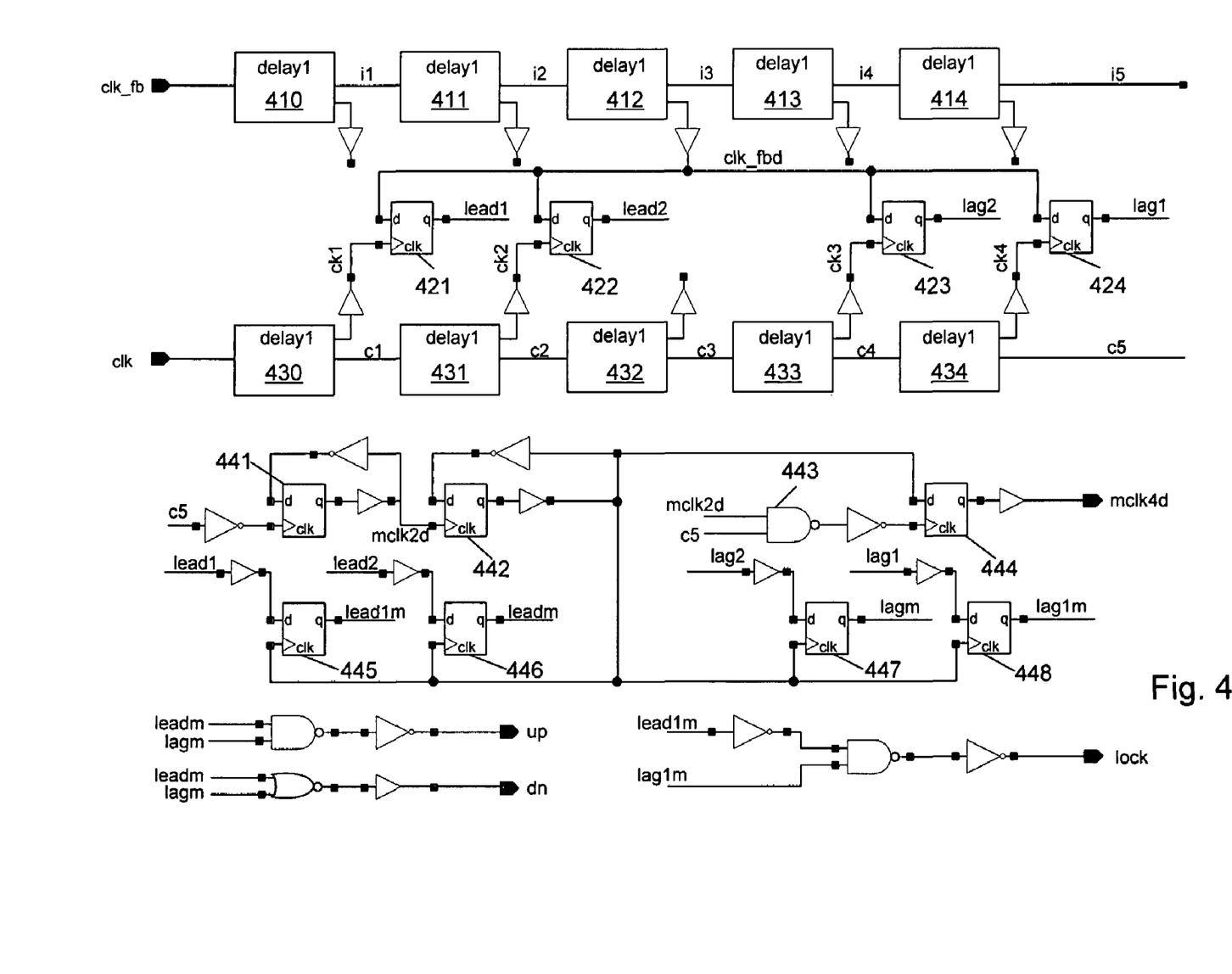
FIG. 4 provides a block diagram illustrating the structure of DLL, according to another embodiment of the present invention.

FIG. 4 illustrates schematically a DLL circuit according to another embodiment of the present invention. Therein, the clk and clk_fb signals are introduced and delay circuits 410-414 and 430-434 are used to determine lead and lag signals to control the delay chain 421-424. Through modules 441-448, the clock signal is adjusted to produce the master clock signal mclk4$d$ used by the slave units. The latter modules also produced additional lag and lead signals such that up, dn and lock signals are produced.

Figure 5:
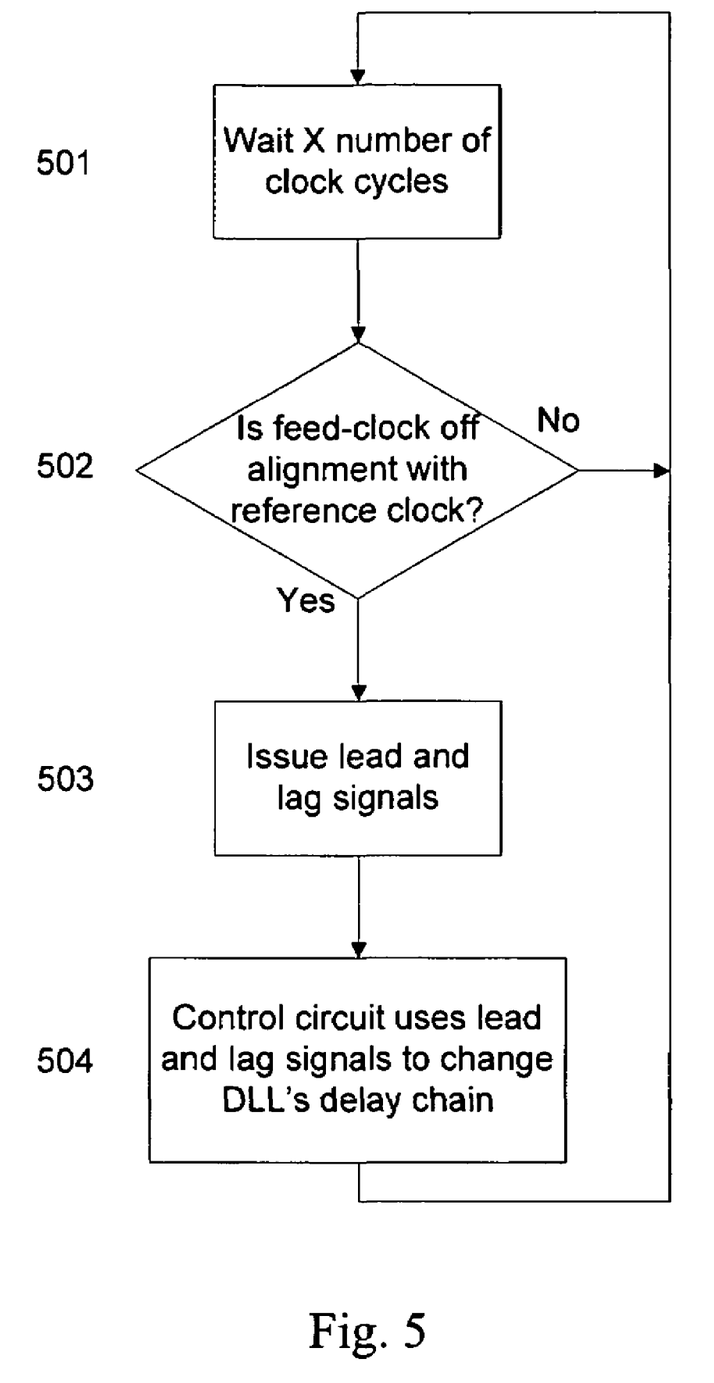
FIG. 5 illustrates a flow chart showing the process of comparing and updating the counters and delay settings in a DLL, according to one embodiment of the present invention.

The method, according to certain embodiments of the present invention, is illustrated in FIG. 5. In step 501, the method awaits a certain number of cycles from the prior update. In step 502, a phase detector or comparable device detects whether the feed-clock is out of alignment with the reference clock. If there is misalignment, then lead and lag signals are issued, in step 503, and those signals are used to change the DLL's delay chain, in step 504. If there is no misalignment, then the process returns to step 501 and awaits the predetermined number of clock cycles.

As such, the present invention avoids the need to include circuitry to detect the glitches or some other mechanism to compensate. Since every fourth cycle, for example, is examined, even if glitches are generated, they are ignored. The present invention removes the possibility of DLL errors by not looking at every clock cycle. The present invention also provides a locked/out of lock register so that the proper condition of the DLL can be readily determined.

Figure 6:
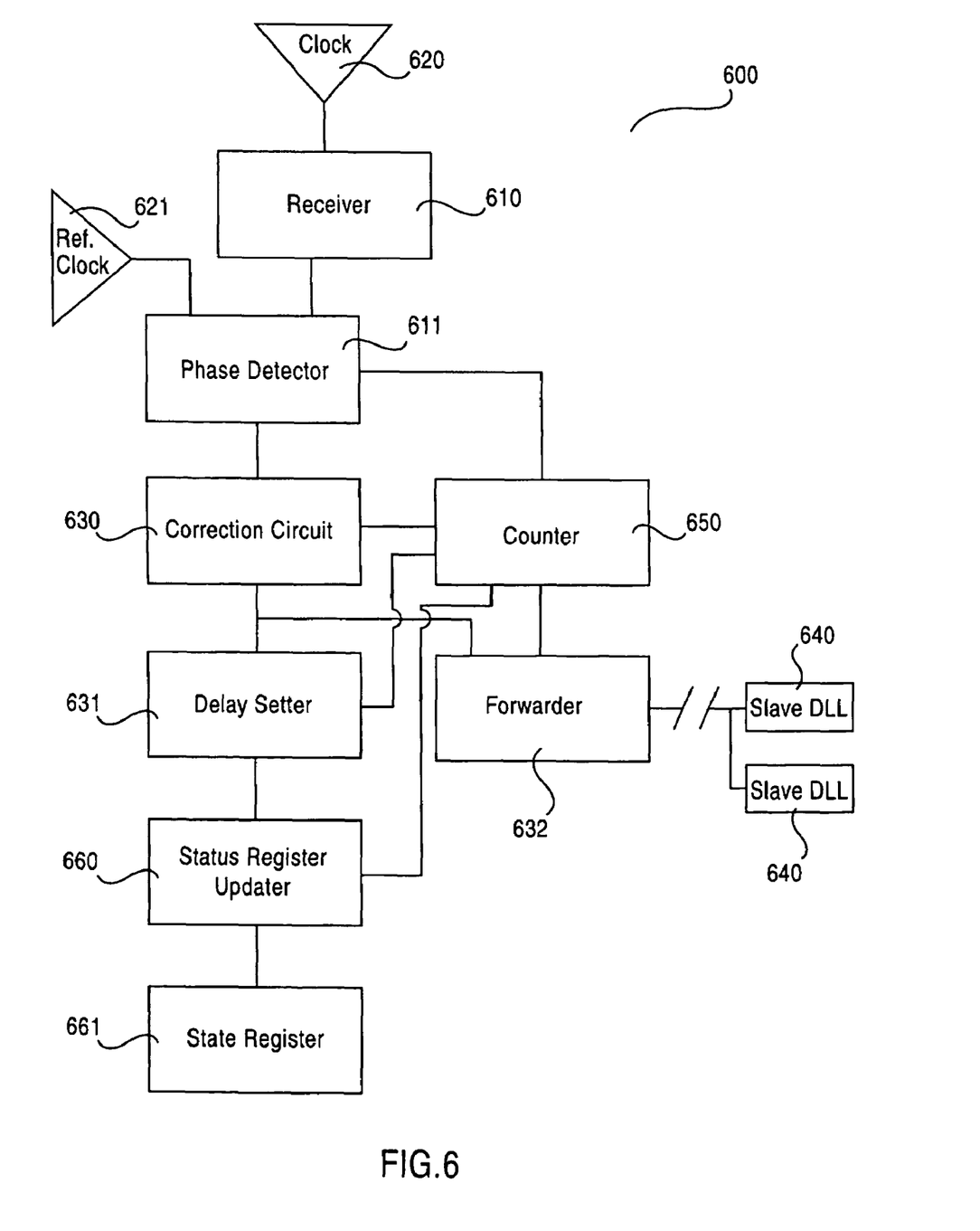
FIG. 6 provides a block diagram illustrating the functional structure of a DLL according to another embodiment of the present invention.

As shown in FIG. 6, A delay-locked loop (DLL) module 600 can include a receiver 610 for receiving a clock 620 signal. The DLL module 600 can also include a phase detector 611 for comparing the clock 620 signal, received by the receiver 610, with a reference clock 621 signal to determine whether a required phase difference between the signals is within specified tolerances. The DLL module 600 can further include a correction circuit 630 for producing a correction signal when the required phase difference between the received clock 620 signal and reference clock 621 signal is not within the specified tolerances. The DLL module 600 can additionally include a delay setter 631 for utilizing the correction signal to change a delay setting. The DLL module 600 can also include a forwarder 632 for forwarding the correction signal to slave DLL modules 640 in communication with the DLL module 600. The DLL module 600 can further include a counter 650, in communication with the phase detector 611, the correction circuit 630, the delay setter 631, and the forwarder 632. The phase detector 611, the correction circuit 630, the delay setter 631 and the forwarder 632 are configured to perform only after the counter 650 has counted for a period of time from a prior use of the phase detector 611, the correction circuit 630, the delay setter and the forwarder. The period of time is sufficient to allow the DLL module 600 to settle and no extraneous results are produced. The DLL module 600 can additionally include a status register updater 660 for updating a state register 661 for the DLL module 600 based on whether the DLL module 600 is in a locked state.

The above-discussed configurations of the invention are made with respect to a delay-locked loop (DLL) module, where such a module may be utilized in a network device, such as a network switch. Such a module may be used in memory circuits, such a SRAM, DRAM and non-volatile memory. A DLL module, according to the instant invention, may be used in embedded control systems, programmable arrays or central processing units. Such a DLL module may be used in all types of semiconductor chips and in non-analog chips. The instant invention may also be used in any application where a clock needs to be shifted, inverted, locked or corrected. Such listed uses of a DLL module are not exhaustive and should be taken merely as examples.

The above-discussed configuration of the invention is, in a preferred embodiment, embodied on a semiconductor substrate, such as silicon, with appropriate semiconductor manufacturing techniques and based upon a circuit layout which would, based upon the embodiments discussed above, be apparent to those skilled in the art. A person of skill in the art with respect to semiconductor design and manufacturing would be able to implement the various modules, interfaces, and tables, buffers, etc. of the present invention onto a single semiconductor substrate, based upon the architectural description discussed above. It would also be within the scope of the invention to implement the disclosed elements of the invention in discrete electronic components, thereby taking advantage of the functional aspects of the invention without maximizing the advantages through the use of a single semiconductor substrate.

Although the invention has been described based upon these preferred embodiments, it would be apparent to those skilled in the art that certain modifications, variations, and alternative constructions would be apparent, while remaining within the spirit and scope of the invention. In order to determine the metes and bounds of the invention, therefore, reference should be made to the appended claims.

The invention claimed is:

1. A method for use in controlling a delay-locked loop (DLL) module, the method comprising:
   permitting a period of time to elapse from a prior incidence of forwarding a correction signal to slave DLL modules in communication with a DLL module, wherein the period of time is configured to allow the DLL to settle and to eliminate production of extraneous results;
   forwarding a new correction signal to slave DLL modules in communication with a DLL module; and
   updating a state register for the DLL based on whether the DLL is in a locked state.

2. The method of claim 1, further comprising:
   configuring the period of time to be a predetermined number of clock cycles.

3. The method of claim 2, wherein the configuring the period of time to be the predetermined number of clock cycles comprises configuring the period of time to be at least four clock cycles.

4. The method of claim 1, further comprising:
   configuring the correction signal to control an external memory.

5. The method of claim 4, further comprising:
   configuring the external memory to be switched out as needed.

6. The method of claim 4, further comprising:
   configuring the external memory to be a random access memory.

7. The method of claim 6, wherein the configuring the external memory to be the random access memory comprises configuring the external memory to be a dynamic random access memory.

8. The method of claim 7, wherein the configuring the external memory to be the dynamic random access memory comprises configuring the external memory to be a synchronous dynamic random access memory.

9. The method of claim 8, wherein the configuring the external memory to be the synchronous dynamic random access memory comprises configuring the external memory to be a double data rate synchronous dynamic random access memory.

10. The method of claim 9, wherein the configuring the external memory to be the double data rate synchronous dynamic random access memory comprises configuring the external memory to be a fast double data rate synchronous dynamic random access memory, wherein fast is defined as having a clock speed of at least about two hundred megahertz.

11. An apparatus for use in controlling a delay-locked loop (DLL) module, the apparatus comprising:
    an elapse unit configured to permit a period of time to elapse from a prior incidence of forwarding a correction signal to slave DLL modules in communication with a DLL module, wherein the period of time is configured to allow the DLL to settle and to eliminate production of extraneous results;
    a forwarder unit configured to forward a new correction signal to slave DLL modules in communication with a DLL module; and
    an update unit configured to update a state register for the DLL based on whether the DLL is in a locked state.

12. The apparatus of claim 11, wherein the period of time comprises a predetermined number of clock cycles.

13. The apparatus of claim 12, wherein the predetermined number of clock cycles comprises at least four clock cycles.

14. The apparatus of claim 11, further comprising:
    a control unit configured to control an external memory using the correction signal.

15. The apparatus of claim 14, wherein the external memory is configured to be switched out as needed.

16. The apparatus of claim 14, wherein the external memory comprises a random access memory.

17. The apparatus of claim 16, wherein the random access memory comprises a dynamic random access memory.

18. The apparatus of claim 17, wherein the dynamic random access memory comprises a synchronous dynamic random access memory.

19. The apparatus of claim 18, wherein the synchronous dynamic random access memory comprises a double data rate synchronous dynamic random access memory.

20. The apparatus of claim 19, wherein the double data rate synchronous dynamic random access memory is configured to have a clock speed of at least about two hundred megahertz.

21. An apparatus for use in controlling a delay-locked loop (DLL) module, the apparatus comprising:
    elapse means for permitting a period of time to elapse from a prior incidence of forwarding a correction signal to slave DLL modules in communication with a DLL module, wherein the period of time is configured to allow the DLL to settle and to eliminate production of extraneous results;
    forwarder means for forwarding a new correction signal to slave DLL modules in communication with a DLL module; and
    update means for updating a state register for the DLL based on whether the DLL is in a locked state.

* * * * *